(12) United States Patent
Lin

(10) Patent No.: US 12,241,698 B2
(45) Date of Patent: Mar. 4, 2025

(54) CONNECTING DEVICE OF LIQUID COOLING MODULE

(71) Applicant: Delta Electronics, Inc., Taoyuan (TW)

(72) Inventor: Yu-Hsien Lin, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 279 days.

(21) Appl. No.: 17/885,116

(22) Filed: Aug. 10, 2022

(65) Prior Publication Data

US 2023/0048859 A1 Feb. 16, 2023

Related U.S. Application Data

(60) Provisional application No. 63/227,442, filed on Aug. 10, 2021.

(30) Foreign Application Priority Data

Jul. 28, 2022 (CN) .......................... 202210897339.0

(51) Int. Cl.
*F16L 41/00* (2006.01)
*F16L 27/08* (2006.01)
*F28F 9/02* (2006.01)

(52) U.S. Cl.
CPC ........ *F28F 9/0256* (2013.01); *F16L 27/0804* (2013.01); *F16L 41/001* (2013.01); *F28F 9/0251* (2013.01); *F28F 9/0258* (2013.01); *F28F 9/0253* (2013.01)

(58) Field of Classification Search
CPC .............................. F28F 9/0256; F28F 9/0251
See application file for complete search history.

(56) References Cited

U.S. PATENT DOCUMENTS

| | | | | |
|---|---|---|---|---|
| 10,791,648 B1* | 9/2020 | Franz | ................. | H05K 7/20272 |
| 2002/0191374 A1* | 12/2002 | Yatougo | ............. | H05K 7/20145 |
| | | | | 165/80.3 |
| 2010/0320753 A1* | 12/2010 | Uneno | ................... | B21D 39/04 |
| | | | | 285/331 |
| 2013/0277008 A1* | 10/2013 | Ishikura | .............. | G01M 3/2853 |
| | | | | 165/200 |
| 2016/0061364 A1* | 3/2016 | Brunschwiler | ....... | F16L 37/138 |
| | | | | 285/308 |
| 2016/0227668 A1* | 8/2016 | Wang | ................. | H05K 7/20727 |
| 2020/0214172 A1* | 7/2020 | Chen | ................. | H05K 7/20272 |
| 2021/0381421 A1* | 12/2021 | Huang | ................ | F16L 27/1017 |

(Continued)

FOREIGN PATENT DOCUMENTS

| | | |
|---|---|---|
| CN | 110608334 B | 7/2021 |
| TW | 202018324 A | 5/2020 |

*Primary Examiner* — Zachary T Dragicevich
*Assistant Examiner* — James A Linford
(74) *Attorney, Agent, or Firm* — MUNCY, GEISSLER, OLDS & LOWE, P.C.

(57) ABSTRACT

A connecting device includes a floating connector, a case, and an elastic sheet. The floating connector has a channel configured to let a liquid pass through it. The elastic sheet includes a first extending structure, a second extending structure, and a curved structure. The first extending structure is affixed to the case. The second extending structure is connected to the floating connector. The head end and the tail end of the curved structure are respectively connected to the first extending structure and the second extending structure.

16 Claims, 6 Drawing Sheets

(56) References Cited

U.S. PATENT DOCUMENTS

2022/0136628 A1* 5/2022 Li .................. F16L 19/0212
                                                    285/19
2023/0050005 A1* 2/2023 Yang ................ F28F 9/0251

* cited by examiner

CONNECTING DEVICE OF LIQUID COOLING MODULE

CROSS REFERENCE TO RELATED APPLICATIONS

The present application claims priority to U.S. Provisional Patent Application No. 63/227,442, filed Aug. 10, 2021, and China Patent Application No. 202210897339.0, filed Jul. 28, 2022, which are incorporated by reference herein in their entirety.

BACKGROUND OF THE INVENTION

Field of the Invention

The application relates in general to a connecting device, and in particular, to a connecting device of a liquid cooling module.

Description of the Related Art

A liquid cooling module for providing liquid (such as water or oil) for cooling can be disposed in a current electronic apparatus to efficiently control the temperature. However, when a connector of the liquid cooling module needs to be connected, this may be difficult due to any deviation in its positioning.

For preventing the aforementioned situation, some connectors include a floating function. However, current floating connectors cannot be used in a small space. Furthermore, since the floating connector may not be completely fixed, an improper force may cause the connector to rotate and damage the connector when the user connects it. Therefore, how to address the aforementioned problem has become an important issue.

BRIEF SUMMARY OF INVENTION

An embodiment of the invention provides a connecting device of a liquid cooling module, including a floating connector, a case, and an elastic sheet. The floating connector has a channel configured to let a fluid pass through it. The elastic sheet includes a first extending structure, a second extending structure, and a curved structure. The first extending structure is affixed to the case. The second extending structure is connected to the floating connector. The head end and the tail end of the curved structure are respectively connected to the first extending structure and the second extending structure.

In some embodiments, the second extending structure has a plate, and the plate is in contact with the floating connector in a detachable manner.

In some embodiments, the first extending structure is substantially parallel to the second extending structure.

In some embodiments, the floating connector further comprises a connecting pillar, the second extending structure comprises an annular portion, and the annular portion is detachably connected to the connecting pillar. The annular portion has an opening, and the connecting pillar is disposed between the opening and the first extending structure.

In some embodiments, the floating connector further comprises an anti-rotation structure, and the case comprises a through hole. The floating connector passes through the through hole, and the anti-rotation structure is accommodated in the through hole to restrict the rotation angle of the floating connector.

In some embodiments, the anti-rotation structure comprises a lateral side, and the through hole comprises a wall facing the lateral side, wherein the farthest distance between the central axis of the floating connector and the lateral side is greater than the shortest distance between the central axis and the wall. The lateral side and the wall are respectively concave and convex. A gap is formed between the anti-rotation structure and the wall.

In some embodiments, the floating connector further comprises a guiding hole disposed adjacent to the channel. The connecting device further comprises a spring connected to the case and the floating connector.

An embodiment of the invention further provides a connecting device of a liquid cooling module, including a floating connector, a case, and a plurality of elastic sheets. The floating connector has a channel configured to let a fluid pass through it. Each of the elastic sheets includes a first extending structure, a second extending structure, and a curved structure. The first extending structure is affixed to the case. The second extending structure is connected to the floating connector. The head end and the tail end of the curved structure are respectively connected to the first extending structure and the second extending structure. The connecting portions of the elastic sheets and the floating connector are rotational symmetric relative to the central axis of the floating connector.

In some embodiments, the floating connector further comprises a plurality of connecting pillars, and each of the second extending structures comprises an annular portion. The annular portions of the second extending structures are detachably connected to the connecting pillars.

In some embodiments, each of the second extending structures comprises an opening. With respect to each elastic sheet, the connecting pillar connected by the elastic sheet is disposed between the opening and the first extending structure. The floating connector substantially has a rectangular cross section, and the connecting pillars are disposed on the corners of the rectangular cross section.

In some embodiments, the floating connector further comprises an anti-rotation structure, and the case comprises a through hole, wherein the floating connector passes through the through hole, and the anti-rotation structure is accommodated in the through hole to restrict the rotation angle of the floating connector.

In some embodiments, the anti-rotation structure comprises a lateral side, and the through hole comprises a wall facing the lateral side, wherein the farthest distance between the central axis and the lateral side is greater than the shortest distance between the central axis and the wall. The lateral side and the wall are respectively concave and convex. A gap is formed between the anti-rotation structure and the wall.

In some embodiments, the floating connector further comprises a guiding hole disposed adjacent to the channel. The connecting device further comprises a spring connected to the case and the floating connector.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the connecting device of the liquid cooling module are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Figure 1:
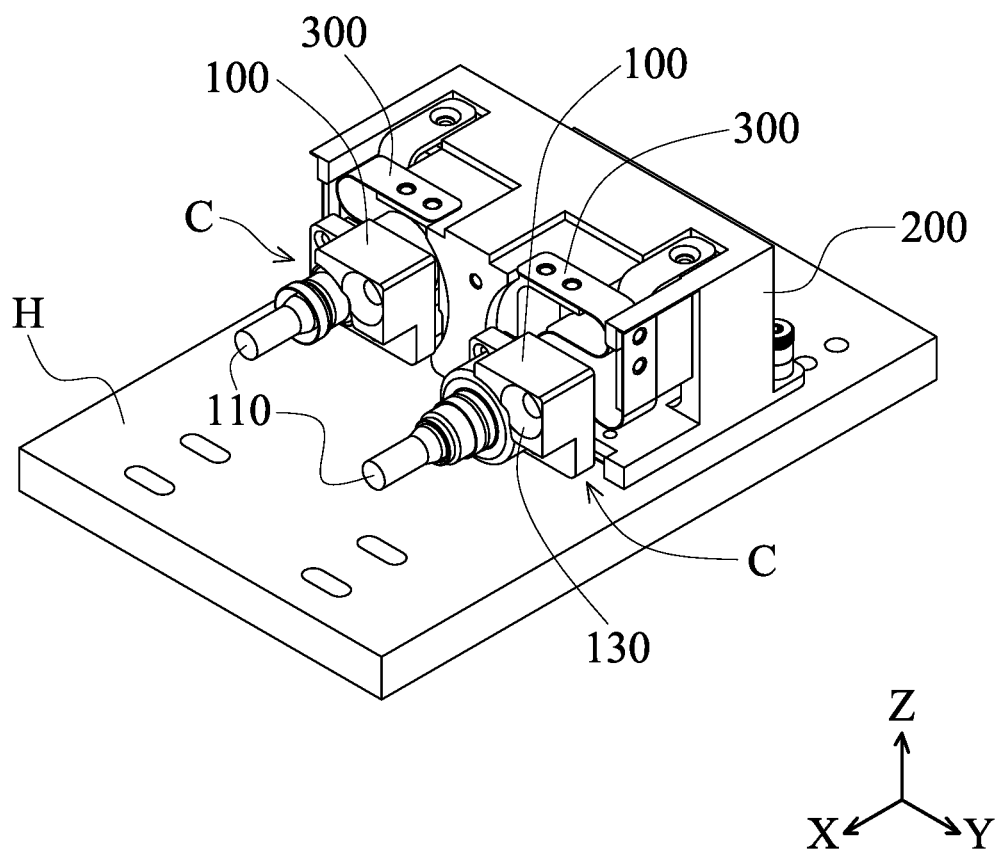
FIG. 1 is a schematic diagram of a connecting device of a liquid cooling module disposed on a housing of an electronic apparatus according to an embodiment of the invention.

Referring to FIG. 1, a connecting device C of a liquid cooling module can be disposed on a housing H of an electronic apparatus (such as a rack of a server or a housing of a computer). The connecting device C can be connected to a fluid supply (such as a fluid supply 10 shown in FIG. 5) and a heating member in the electronic apparatus (such as a central processing unit (CPU), a graphics processing unit (GPU), a hard disk, and/or etc.), so that the fluid supply can provide a fluid for cooling to the heating member through the connecting device C. Therefore, the fluid for cooling can absorb the heat from the heating member, so as to reduce the temperature of the heating member.

Figure 2:
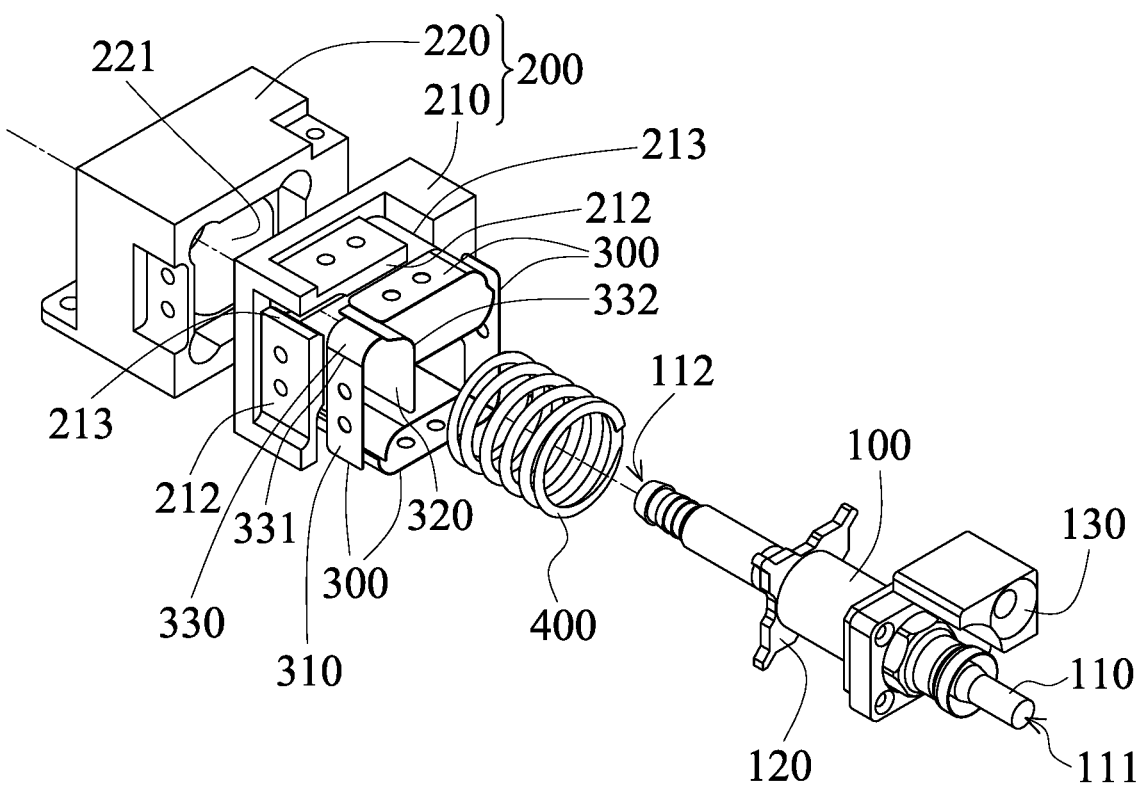
FIG. 2 is an exploded-view diagram of the connecting device of the liquid cooling module according to an embodiment of the invention.

FIG. 2 is an exploded-view diagram of the connecting device C shown in FIG. 1. As shown in FIG. 1 and FIG. 2, the connecting device C of the liquid cooling module primarily includes a floating connector 100, a case 200, and a plurality of elastic sheets 300. The floating connector 100 has a channel 110, and the opposite ends 111 and 112 of the channel 100 can be respectively connected to the liquid cooling module and the heating member via a tube. The case 200 can be affixed to the housing H of the electronic apparatus, and can surround the floating connector 100 to protect the floating connector 100 from being struck by an external member. In some embodiments, the case 200 is a part of the housing H of the electronic apparatus.

Figure 3:
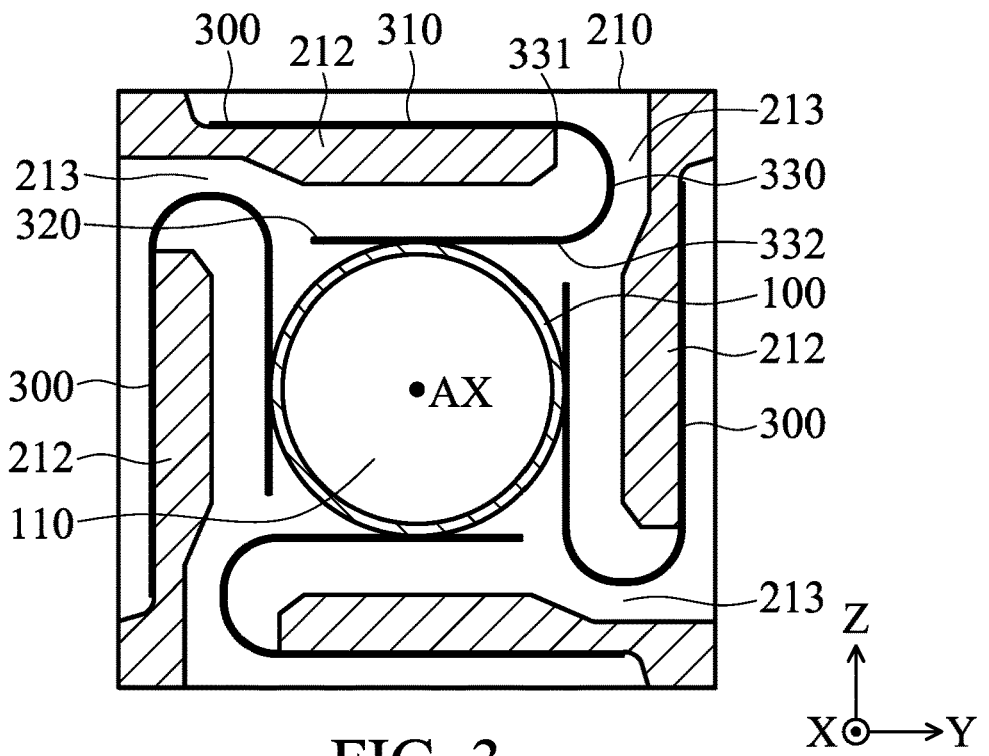
FIG. 3 is a schematic diagram of a floating connector, a first case, and an elastic sheet according to an embodiment of the invention.

Referring to FIG. 1 to FIG. 3, in this embodiment, the case 200 includes a first case 210. The floating connector 100 can be extended along the X-axis and passing through the first case 210. The first case 210 substantially has a rectangular cross section, and an assembly portion 212 and a hole 213 can be formed on each of its four sides. The elastic sheet 300 can be affixed to the outer surface of the assembly portion 212 and pass through the hole 213. In particular, the elastic sheet 300 includes a first extending structure 310, a second extending structure 320, and a curved structure 330. The first extending structure 310 is affixed to the outer surface of the assembly portion 212. The second extending structure 320 is disposed between the assembly portion 212 and the floating connector 100. The curved structure 330 passes through the hole 213 and connects the first extending structure 310 to the second extending structure 320. The elastic sheet 300 can provide a support force that a spring cannot provide, so that the floating connector 100 can be floated with a sufficient support force.

Each of the first extending structure 310 and the second extending structure 320 is substantially a plate (i.e. a plate-shaped structure), and they are parallel to each other. The curved structure 330 extends substantially along a circular arc curve line. The head end 331 of the curved structure 330 is connected to the first extending structure 310, and the tail end 332 of the curved structure 330 is connected to the second extending structure 320. Therefore, the first extending structure 310, the second extending structure 320, and the curved structure 330 can substantially form a U-shaped cross section. When the floating connector 100 passes through the first case 210, the second extending structure 320 of the elastic sheet 330 can be in contact with the floating connector 100 in a separable manner. Owing to the elastic force of the elastic sheet 300, when the tube of the fluid supply is not connected to the floating connector 100, the floating connector 100 can be positioned in a predetermined position. Moreover, since the elastic sheet 300 is flexible, the floating connector 100 can move relative to the case 200 in a limited range. Thus, when the position of the tube of the fluid supply is deviated from the position of the floating connector 100, the floating connector 100 can move to correspond to the position of the tube, and the user can still connect the tube to the floating connector 100.

In this embodiment, all of the elastic sheets 300 in the connecting device C have the same shape and dimensions, and they are disposed in a rotational symmetric manner relative to the central axis AX of the floating connector 100.

Figure 4:
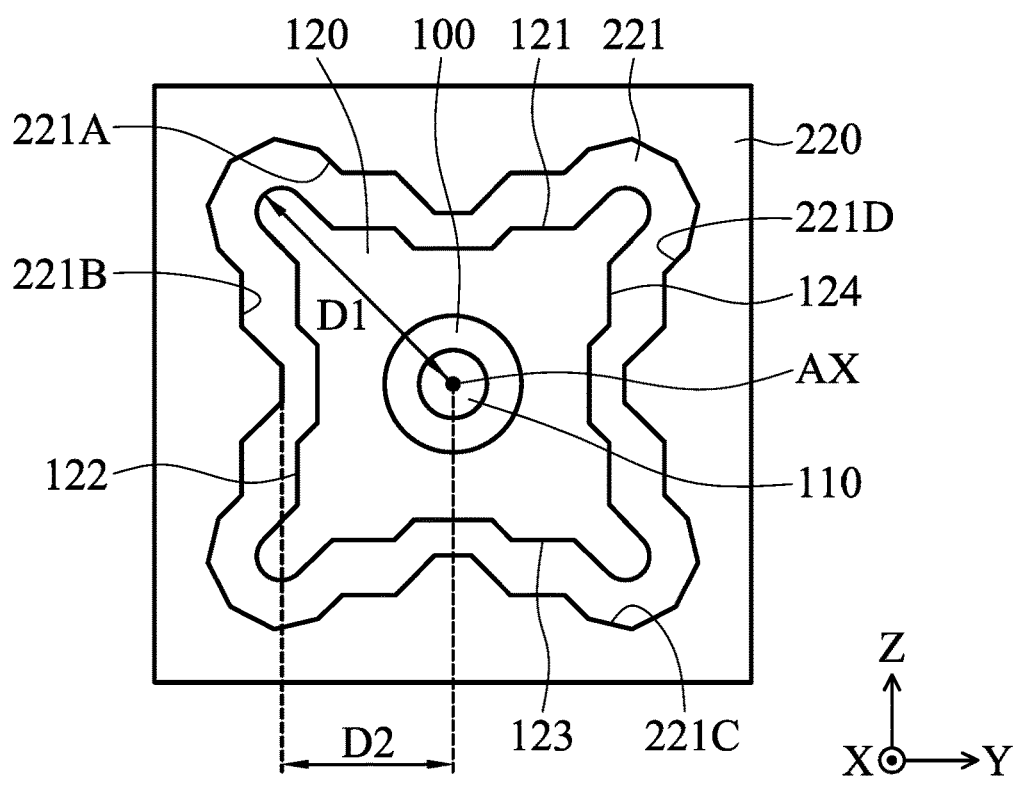
FIG. 4 is a schematic diagram of a second case and an anti-rotation structure according to an embodiment of the invention.

Referring to FIG. 2 and FIG. 4, in this embodiment, the case 200 further includes a second case 220. The first case 210 and the second case 220 can be connected to each other or can be integrally formed as one piece. The second case 220 has a through hole 221, and the floating connector 100 extends along the X-axis and passes through the through hole 221. Specifically, the floating connector 100 has an anti-rotation structure 120 accommodated in the through hole 221.

The anti-rotation structure 120 has four lateral sides 121, 122, 123, and 124, and all of the lateral sides 121, 122, 123 and 124 are concave. The walls of the through hole 221 facing the lateral sides 121, 122, 123, and 124 are respectively the walls 221A, 221B, 221C, and 221D. These walls 221A, 221B, 221C, and 221D are formed to be convex to correspond to the appearance of the lateral sides 121, 122, 123, and 124. Since the farthest distance between the central axis AX of the floating connector 100 and the lateral sides 121, 122, 123, 124 (such as distance D1) is greater than the shortest distance between the central axis AX of the floating connector 100 and walls 221A, 221B, 221C, 221D (such as distance D2), the rotation angle of the floating connector 100 can be restricted. For example, owing to the through hole 221 and the anti-rotation structure 120, the floating connector 100 can only rotate 5-10 degrees relative to the case 200.

Since there are gaps formed between the lateral sides 121, 122, 123, 124 of the anti-rotation structure 120 and the walls 221A, 221B, 221C, 221D of the through hole 221, the floating connector 100 can still move relative to the case 200 along the Y-axis and/or the Z-axis to achieve the purpose of floating even though the floating connector 100 has an anti-rotation structure 120.

Figure 5:
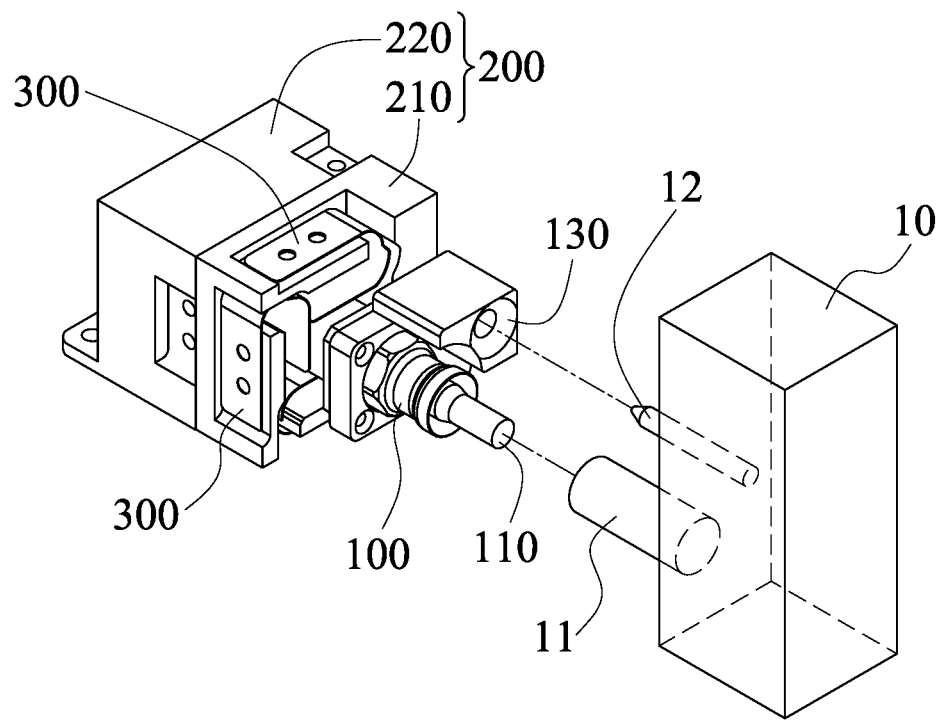
FIG. 5 is a schematic diagram of the connecting device of the liquid cooling module connected to a fluid supply according to an embodiment of the invention.
Figure 5:
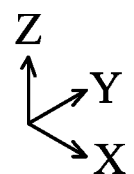

Referring to FIG. 1, FIG. 2, and FIG. 5, in this embodiment, the floating connector 100 further includes a guiding hole 130. The guiding hole 130 is disposed adjacent to the channel 110 of the floating connector 100, and a guiding pillar 12 corresponding to the guiding hole 130 is disposed adjacent to the tube 11 of the fluid supply 10. Therefore, when the user wants to connect the tube 11 of the fluid supply 10 to the floating connector 100, the guiding pillar 12 can enter the guiding hole 130 of the floating connector 100 in advance to adjust the position of the tube 11 of the fluid supply 10 to correspond to the position of the channel 110 of the floating connector 100.

In this embodiment, the connecting device C further includes a spring 400 connected to the case 200 and the floating connector 100. For example, the spring 400 can be a compression spring. When the tube of the fluid supply and the floating connector 100 are connected, the elastic force of the spring 400 can provide a buffer, and can make the tube and the floating connector 100 to connect securely.

Figure 6:
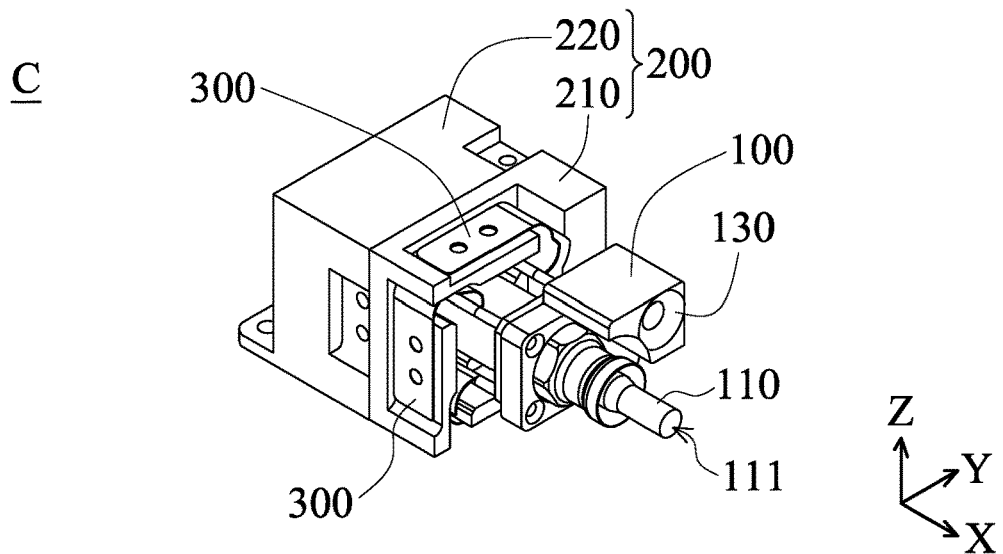
FIG. 6 is a schematic diagram of a connecting device of a liquid cooling module according to another embodiment of the invention.
Figure 7:
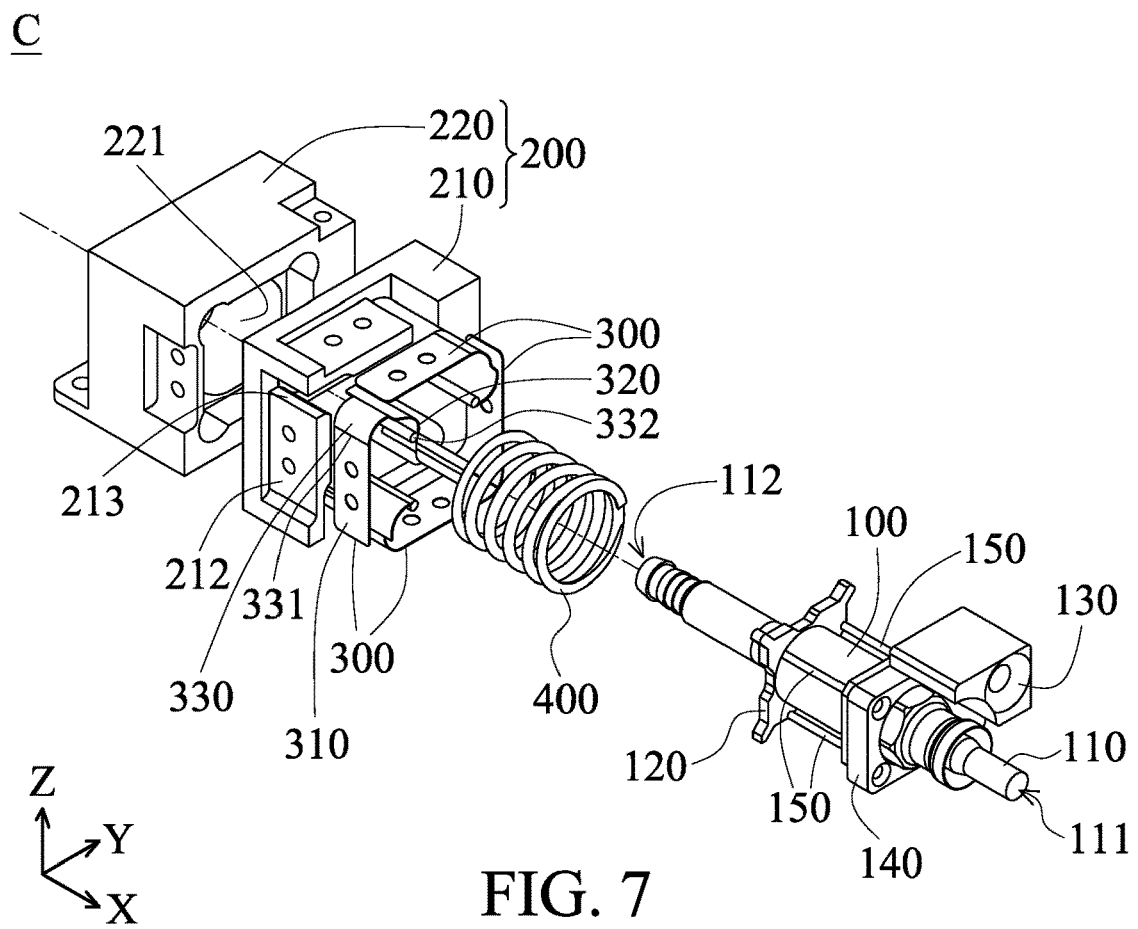
FIG. 7 is an exploded-view diagram of the connecting device of the liquid cooling module according to another embodiment of the invention.

Referring to FIG. 6 and FIG. 7, in another embodiment of the invention, a connecting device C of the liquid cooling module primarily includes a floating connector 100, a case 200, and a plurality of elastic sheets 300. The floating connector 100 has a channel 110, and the opposite ends 111 and 112 of the channel 100 can be respectively connected to the liquid cooling module and the heating member via a tube. In this embodiment, the floating connector 100 further includes a rectangular portion 140 and a plurality of connecting pillars 150. The rectangular portion 140 has a rectangular cross section. The connecting pillars 150 are disposed on the rectangular portion 140, and situated at the corners of the rectangular portion 140.

Figure 8:
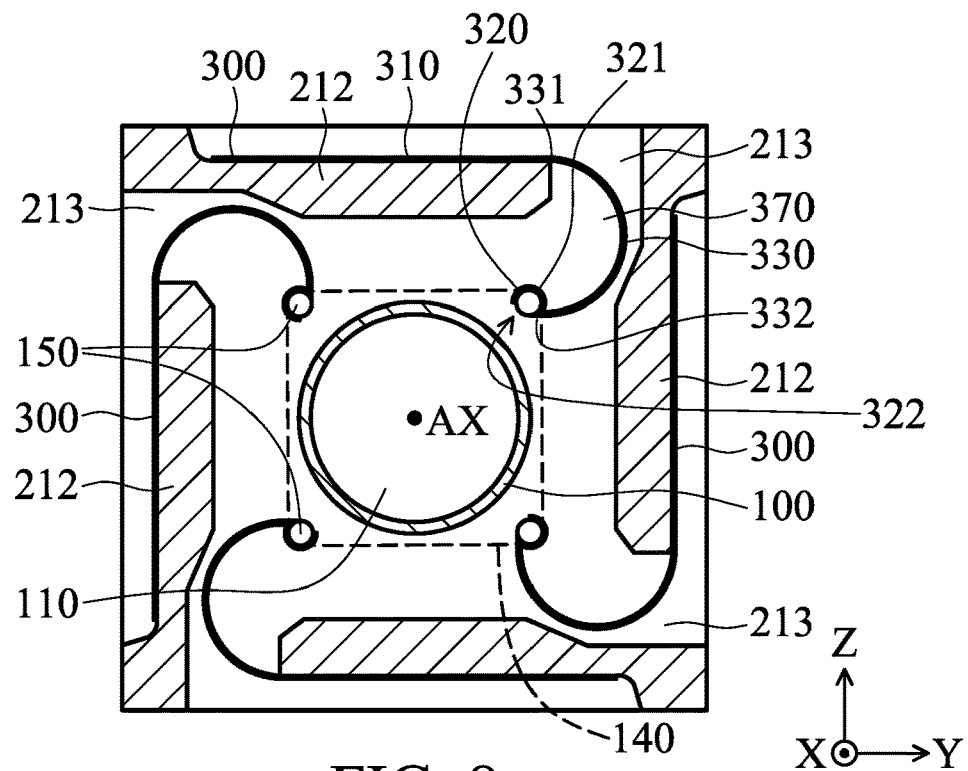
FIG. 8 is a schematic diagram of a floating connector, a first case, and an elastic sheet according to another embodiment of the invention.

The case 200 can be affixed to the housing H of the electronic apparatus, and can surround the floating connector 100 to protect the floating connector 100 from being struck by an external member. As shown in FIG. 6 to FIG. 8, in this embodiment, the case 200 includes a first case 210. The floating connector 100 can be extended along the X-axis and passing through the first case 210. The first case 210 substantially has a rectangular cross section, and an assembly portion 212 and a hole 213 can be formed on each of its four sides. The elastic sheet 300 can be affixed to the outer surface of the assembly portion 212 and pass through the hole 213. In particular, the elastic sheet 300 includes a first extending structure 310, a second extending structure 320, and a curved structure 330. The first extending structure 310 is affixed to the outer surface of the assembly portion 212. The second extending structure 320 is disposed between the assembly portion 212 and the floating connector 100. The curved structure 330 passes through the hole 213 and connects the first extending structure 310 to the second extending structure 320.

The first extending structure 310 is substantially a plate, and the curved structure 330 extends substantially along a circular arc curve line. The head end 331 of the curved structure 330 is connected to the first extending structure 310, and the tail end 332 of the curved structure 330 is connected to the second extending structure 320. The second extending structure 320 includes an annular portion 321. The annular portions 321 of the second extending structures 320 of the connecting device C are connected to the connecting pillars 150 on the floating connector 100 in a detachable and one-to-one manner. Specifically, in one elastic sheet 300 and one connecting pillar 150 that are connected to each other, the connecting pillar 150 is disposed between the opening 322 of the annular portion 321 and the first extending structure 310.

Owing to the elastic force of the elastic sheet 300, when the tube of the fluid supply is not connected to the floating connector 100, the floating connector 100 can be positioned in a predetermined position. Moreover, since the elastic sheet 300 is flexible, the floating connector 100 can move relative to the case 200 in a limited range. Thus, when the position of the tube of the fluid supply is deviated from the position of the floating connector 100, the floating connector 100 can move to correspond to the position of the tube, and the user can still connect the tube to the floating connector 100.

In this embodiment, the connecting portions of the elastic sheets 300 and the floating connector 100 (i.e. the engaging positions of the annular portion 321 and the connecting pillars 150) are rotational symmetric relative to the central axis AX of the floating connector 100.

Figure 9:
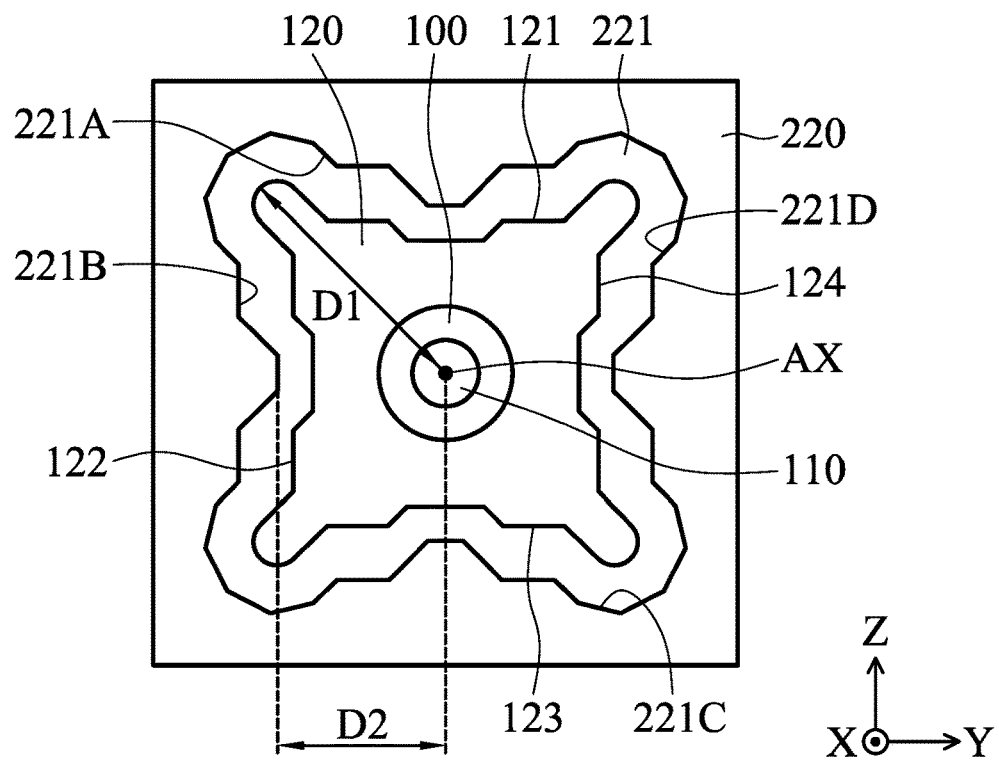
FIG. 9 is a schematic diagram of a second case and an anti-rotation structure according to another embodiment of the invention.

Referring to FIG. 7 and FIG. 9, in this embodiment, the case 200 further includes a second case 220. The first case 210 and the second case 220 can be connected to each other or can be integrally formed as one piece. The second case 220 has a through hole 221, and the floating connector 100 extends along the X-axis and passes through the through hole 221. The floating connector 100 has an anti-rotation structure 120 accommodated in the through hole 221.

The anti-rotation structure 120 has four lateral sides 121, 122, 123, and 124, and all of the lateral sides 121, 122, 123 and 124 are concave. The walls of the through hole 221 facing the lateral sides 121, 122, 123, and 124 are respectively the walls 221A, 221B, 221C, and 221D. These walls 221A, 221B, 221C, and 221D are formed to be convex to correspond to the appearance of the lateral sides 121, 122, 123, and 124. Since the farthest distance between the central axis AX of the floating connector 100 and the lateral sides 121, 122, 123, 124 (such as distance D1) is greater than the shortest distance between the central axis AX of the floating connector 100 and walls 221A, 221B, 221C, 221D (such as distance D2), the rotation angle of the floating connector 100 can be restricted. For example, owing to the through hole 221 and the anti-rotation structure 120, the floating connector 100 can only rotate 5-10 degrees relative to the case 200.

Since there are gaps formed between the lateral sides 121, 122, 123, 124 of the anti-rotation structure 120 and the walls 221A, 221B, 221C, 221D of the through hole 221, the floating connector 100 can still move relative to the case 200 along the Y-axis and/or the Z-axis to achieve the purpose of floating even though the floating connector 100 has an anti-rotation structure 120.

Referring to FIG. 6 and FIG. 7, in this embodiment, the floating connector 100 further includes a guiding hole 130. The guiding hole 130 is disposed adjacent to the channel 110 of the floating connector 100, and a guiding pillar corresponding to the guiding hole 130 is disposed adjacent to the tube of the fluid supply. Therefore, when the user wants to connect the tube of the fluid supply to the floating connector 100, the guiding pillar can enter the guiding hole 130 of the floating connector 100 in advance to adjust the position of the tube of the fluid supply to correspond to the position of the channel 110 of the floating connector 100.

In this embodiment, the connecting device C further includes a spring 400 connected to the case 200 and the floating connector 100. For example, the spring 400 can be a compression spring. When the tube of the fluid supply and the floating connector 100 are connected, the elastic force of the spring 400 can provide a buffer, and can make the tube and the floating connector 100 to connect securely.

In summary, an embodiment of the invention provides a connecting device of a liquid cooling module, including a floating connector, a case, and an elastic sheet. The floating connector has a channel configured to let a fluid pass through it. The elastic sheet includes a first extending structure, a second extending structure, and a curved structure. The first extending structure is affixed to the case. The second extending structure is connected to the floating connector. The head end and the tail end of the curved structure are respectively connected to the first extending structure and the second extending structure.

An embodiment of the invention further provides a connecting device of a liquid cooling module, including a floating connector, a case, and a plurality of elastic sheets. The floating connector has a channel configured to let a fluid pass through it. Each of the elastic sheets includes a first extending structure, a second extending structure, and a curved structure. The first extending structure is affixed to the case. The second extending structure is connected to the floating connector. The head end and the tail end of the curved structure are respectively connected to the first extending structure and the second extending structure. The connecting portions of the elastic sheets and the floating connector are rotational symmetric relative to the central axis of the floating connector.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A connecting device of a liquid cooling module, comprising:
   a floating connector, having a channel for a fluid passing through;
   a case; and
   an elastic sheet, comprising:
   a first extending structure affixed to the case;
   a second extending structure connected to the floating connector; and
   a curved structure, wherein a head end of the curved structure is connected to the first extending structure, and a tail end of the curved structure is connected to the second extending structure,
   wherein the floating connector comprises an anti-rotation structure, the case comprises a through hole, the floating connector passes through the through hole, and the anti-rotation structure is accommodated in the through hole to restrict the rotation angle of the floating connector,
   wherein the anti-rotation structure comprises a lateral side, and the through hole comprises a wall facing the lateral side, wherein a farthest distance between a central axis of the floating connector and the lateral side is greater than a shortest distance between the central axis and the wall.

2. The connecting device as claimed in claim 1, wherein the second extending structure has a plate in contact with the floating connector in a detachable manner.

3. The connecting device as claimed in claim 1, wherein the first extending structure is substantially parallel to the second extending structure.

4. The connecting device as claimed in claim 1, wherein the floating connector further comprises a connecting pillar, the second extending structure comprises an annular portion detachably connected to the connecting pillar.

5. The connecting device as claimed in claim 4, wherein the annular portion has an opening, and the connecting pillar is disposed between the opening and the first extending structure.

6. The connecting device as claimed in claim 1, wherein the anti-rotation structure comprises a lateral side, the through hole comprises a wall facing the lateral side, and the lateral side and the wall are concave and convex, respectively.

7. The connecting device as claimed in claim 1, wherein the through hole comprises a wall, and a gap is formed between the anti-rotation structure and the wall.

8. The connecting device as claimed in claim 1, wherein the floating connector further comprises a guiding hole disposed adjacent to the channel.

9. The connecting device as claimed in claim 1, wherein the connecting device further comprises a spring connected to the case and the floating connector.

10. A connecting device of a liquid cooling module, comprising:
    a floating connector, having a channel for a fluid passing through;
    a case; and
    a plurality of elastic sheets, wherein each of the elastic sheets comprises:

a first extending structure, affixed to the case;

a second extending structure, connected to the floating connector to form a connecting portion; and a curved structure, wherein a head end of the curved structure is connected to the first extending structure, and a tail end of the curved structure is connected to the second extending structure, wherein the connecting portions of the elastic sheets and the floating connector are symmetrically disposed relative to a central axis of the floating connector, wherein the floating connector comprises an anti-rotation structure, the case comprises a through hole, the floating connector passes through the through hole, and the anti-rotation structure is accommodated in the through hole to restrict the rotation angle of the floating connector, wherein the anti-rotation structure comprises a lateral side, and the through hole comprises a wall facing the lateral side, wherein a farthest distance between the central axis and the lateral side is greater than a shortest distance between the central axis and the wall.

11. The connecting device as claimed in claim 10, wherein the floating connector further comprises a plurality of connecting pillars, and each of the second extending structures comprises an annular portion, wherein the annular portions of the second extending structures are detachably connected to the connecting pillars.

12. The connecting device as claimed in claim 11, wherein each of the second extending structures comprises an opening, wherein for each elastic sheet, the connecting pillar connected by the elastic sheet is disposed between the opening and the first extending structure.

13. The connecting device as claimed in claim 11, wherein the floating connector substantially has a rectangular cross section, and the connecting pillars are disposed on the corners of the rectangular cross section.

14. The connecting device as claimed in claim 10, wherein the anti-rotation structure comprises a lateral side, the through hole comprises a wall facing the lateral side, and the lateral side and the wall are concave and convex, respectively.

15. The connecting device as claimed in claim 10, wherein the floating connector further comprises a guiding hole disposed adjacent to the channel.

16. The connecting device as claimed in claim 10, wherein the connecting device further comprises a spring connected to the case and the floating connector.

* * * * *